United States Patent
Caldwell et al.

(10) Patent No.: US 9,099,759 B2
(45) Date of Patent: Aug. 4, 2015

(54) MULTIMODE POWER MODULE

(75) Inventors: David J. Caldwell, Carlsbad, CA (US);
Peter J. Carian, Inglewood, CA (US);
Michael A. Willhoff, Playa del Rey, CA (US)

(73) Assignee: The Aerospace Corporation, El Segundo, CA (US)

( * ) Notice: Subject to any disclaimer, the term of this patent is extended or adjusted under 35 U.S.C. 154(b) by 1699 days.

(21) Appl. No.: 11/789,014

(22) Filed: Apr. 23, 2007

(65) Prior Publication Data
US 2008/0258675 A1  Oct. 23, 2008

(51) Int. Cl.
| | |
|---|---|
| H02J 7/06 | (2006.01) |
| H01M 10/44 | (2006.01) |
| H01L 31/02 | (2006.01) |
| H01M 10/46 | (2006.01) |
| H02J 7/35 | (2006.01) |

(52) U.S. Cl.
CPC ......... *H01M 10/44* (2013.01); *H01L 31/02021* (2013.01); *H01M 10/465* (2013.01); *H02J 7/35* (2013.01); *Y02E 10/50* (2013.01)

(58) Field of Classification Search
CPC .................................. H02J 7/00; H01M 10/44
USPC .................. 320/158, 101, 108, 128, 162, 163
See application file for complete search history.

(56) References Cited

U.S. PATENT DOCUMENTS

| | | | |
|---|---|---|---|
| 7,514,900 B2 * | 4/2009 | Sander et al. | 320/101 |
| 2006/0171182 A1 * | 8/2006 | Siri et al. | 363/131 |

* cited by examiner

*Primary Examiner* — Edward Tso
*Assistant Examiner* — Aaron Piggush
(74) *Attorney, Agent, or Firm* — Paul D. Chancellor; Ocean Law

(57) ABSTRACT

A multimode power module system automatically selects one of multiple operating modes to maximize power transfer in varying conditions by using direct energy transfer, boost peak power tracking, buck peak power tracking, charge limit, and eclipse standby modes with reduced switching losses, reduced component count, and scalability through connections of multiple power modules system.

16 Claims, 3 Drawing Sheets

MULTIMODE POWER MODULE SYSTEM

MULTIMODE POWER MODULE SYSTEM

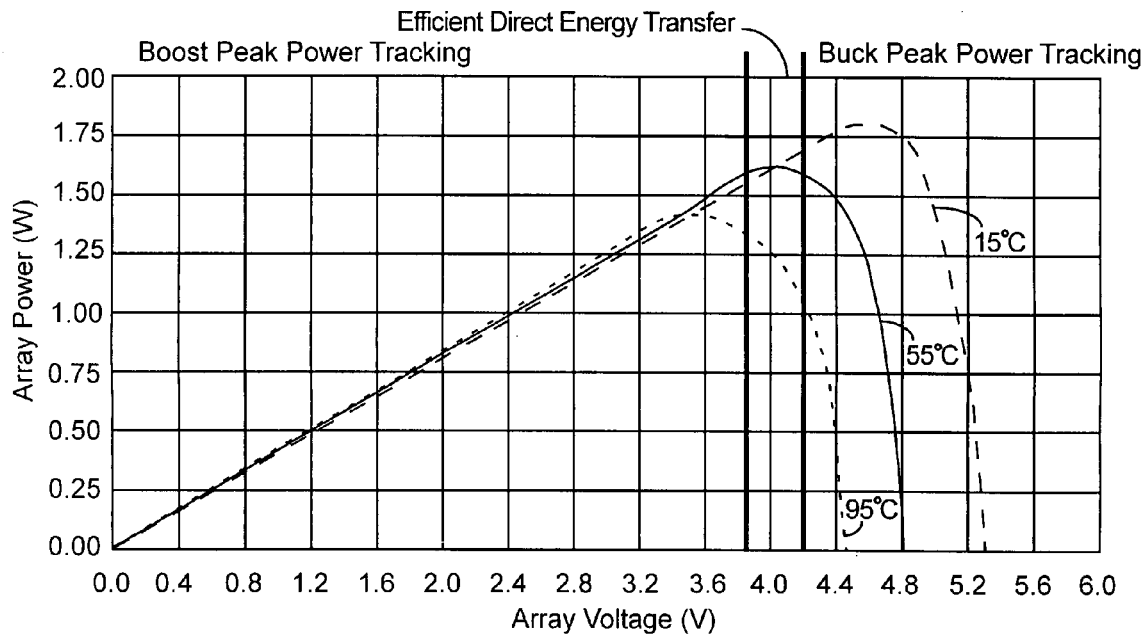
FIG. 2  (PRIOR ART) ARRAY POWER TO BATTERY CHARGE VOLTAGE OVER TEMPERATURE PERFORMANCE
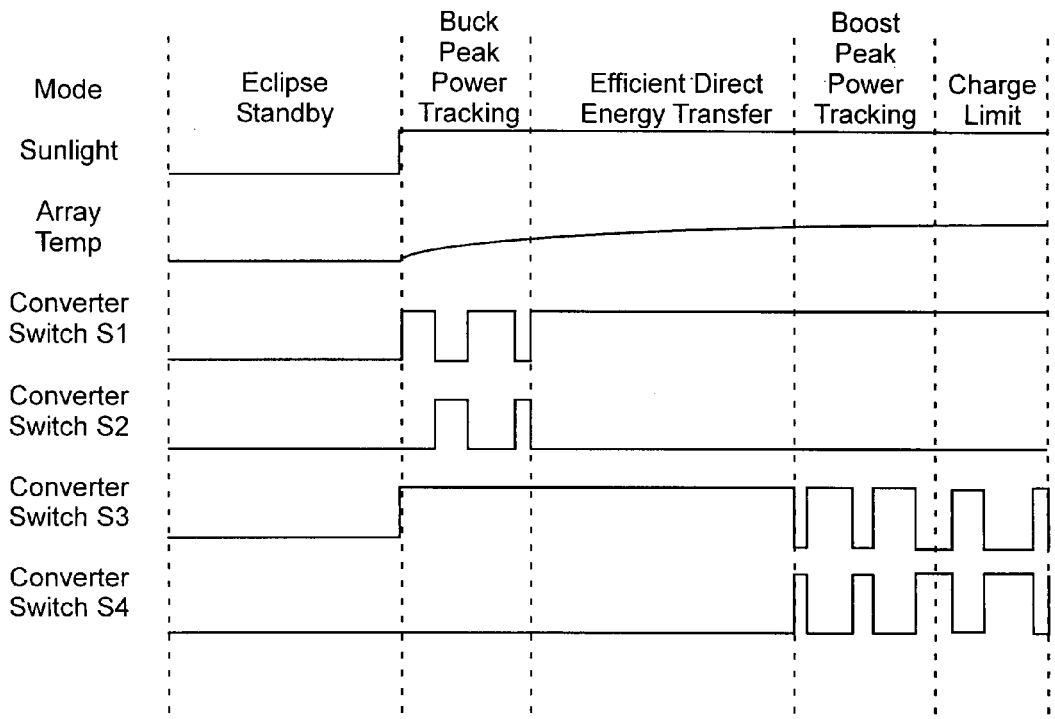
FIG. 3  MULTIMODE OPERATION TIMING

MULTIMODE POWER MODULE

FIELD OF THE INVENTION

The invention relates to the field of power supplies and battery chargers. More particularly, the present invention relates to multimode battery charging power modules for efficient energy transfer from solar cells to a battery.

BACKGROUND OF THE INVENTION

Power modules on space system have long been used to charge onboard batteries and provide power to system loads. Referring to FIG. 2, the power transfer from an array of solar cells to a battery is a function of temperature and sunlight illumination. The temperature is shown to have a range between 95° C. degrees to 15° C. degrees, having a nominal temperature of 55° C. degrees. A battery can be charged in three power modes including direct energy transfer (DET), boost peak power tracking (PPT), and buck PPT. During the DET mode, the power module connects source array to the battery and load for high efficiency. Peak power tracking (PPT) mode is used during high and low array voltages in response to varying temperature and illumination conditions for maximum source power but power efficiency transfer is lower due to switching and controller losses.

The PPT has two operating conditions, boost PPT and buck PPT. Power module utilization of DET, buck PPT, and boost PPT modes as a function of array temperature is well known. DET is effective at nominal temperatures when the maximum power voltage of the array is near the battery charge voltage. Buck PPT is implemented when the array is cold and the maximum power voltage is significantly higher than the battery charge voltage. Buck PPT decreases the voltage from the array to the battery. Boost PPT is used at high temperatures when the maximum power voltage of the array is significantly lower than the battery charge voltage. Boost PPT increases the voltage from the array to the battery.

Power modules have been used on miniature satellites but suffer from power losses associated with PPT switching. Switching power losses are disadvantageously significant relative to overall power. The DET is more advantageous much of the time but not under all conditions.

U.S. Pat. No. 6,713,989 teaches a solar switch, by Reynolds, and discloses an electronic switch that maintains full conduction between solar array and battery during charging. Efficiency is high in this simple technique because losses associated with power switching and complex controls are eliminated. However, maximum source power is not continuously extracted by this DET method because array voltage is equal to varying battery voltage. The influence of array temperature and degradation to power generation is neglected.

U.S. Pat. No. 4,794,272 teaches a power regulator utilizing only battery current monitoring, by Bavaro, and discloses a PPT method to extract maximum array power. However, power dissipation is significant because the switching converter and control circuit are continuously active. Therefore, less power may be delivered to the load or battery than the DET mode despite maximum power being extracted from the solar array.

U.S. Pat. No. 6,469,476 teaches a multimode converter for a motor vehicle electrical system, by Barrett, and discloses a power system with multiple operating modes. However, the system is designed specifically for motors and is not directly applicable to other systems such as solar power. The converter disadvantageously has an excessive component count. A control unit of the converter is not described as including a low power standby mode for power conservation.

Converters have long been used in regulated power supplies. Converters are supplied in compact packages but are unsuitable of DET. Existing power modules disadvantageously suffer from PPT switching losses, excessive component count, exclusive continuous high power operation without entering standby modes, and stand alone connections between a power source and loads. These and other disadvantages are solved or reduced using the invention.

SUMMARY OF THE INVENTION

An object of the invention is to provide a multimode power system with reduced switching and overhead losses during direct energy transfer.

Another object of the invention is to provide a multimode power system with peak power tracking during varying conditions.

Yet another object of the invention is to provide a multimode power system with reduced component count.

Still another object of the invention is to provide a multimode power system with a low power standby mode.

A further object of the invention is to provide a multimode power system that can be expanded to increase power to many loads.

Still a further object of the invention is to provide a multimode power system for high efficiency power transfer between solar cells and a load during direct energy transfer, boost peak power tracking, and buck peak power tracking.

The present invention is a multimode power system that automatically selects one of the multiple operating modes to maximize output power when an attached battery is not fully charged. The system normally operates through direct energy transfer (DET) or peak power tracking (PPT). The system automatically switches between DET, boost PPT, and buck PPT modes. During the DET, the system connects a source, which may be a solar array, to an output, which may include a battery and a load, for high power transfer efficiency. The system extracts a maximum source power over a limited range of operating conditions. During PPT, the system adjusts the power transfer to varying conditions for maximum source power but the power transfer efficiency is lower than the DET due to switching and controller losses. Multimode power module automatically selects DET or PPT to continuously maximize output power to the battery and load. Low power systems such as miniature satellites particularly benefit from this the multimode power selection method because power losses associated with PPT are significantly reduced relative to overall power.

A single power supply converter is used to enable operation of the modes in a compact design. In a preferred form, an inductor is used to conduct output current in a converter. The converter enables both DET and PPT modes as well as eclipse standby, and charge limit modes. The power system selects DET when advantageous much of the time for maximized power transfer. The multimode power modules can be connected in parallel or series to accommodate different power requirements with minimal effort. These and other advantages will become more apparent from the following detailed description of the preferred embodiment.

BRIEF DESCRIPTION OF THE DRAWINGS

FIG. 2 is a prior graph of array power to battery charge voltage over temperature performance.

FIG. 3 is a multimode operational timing diagram.

DETAILED DESCRIPTION OF THE PREFERRED EMBODIMENT

Figure 1:
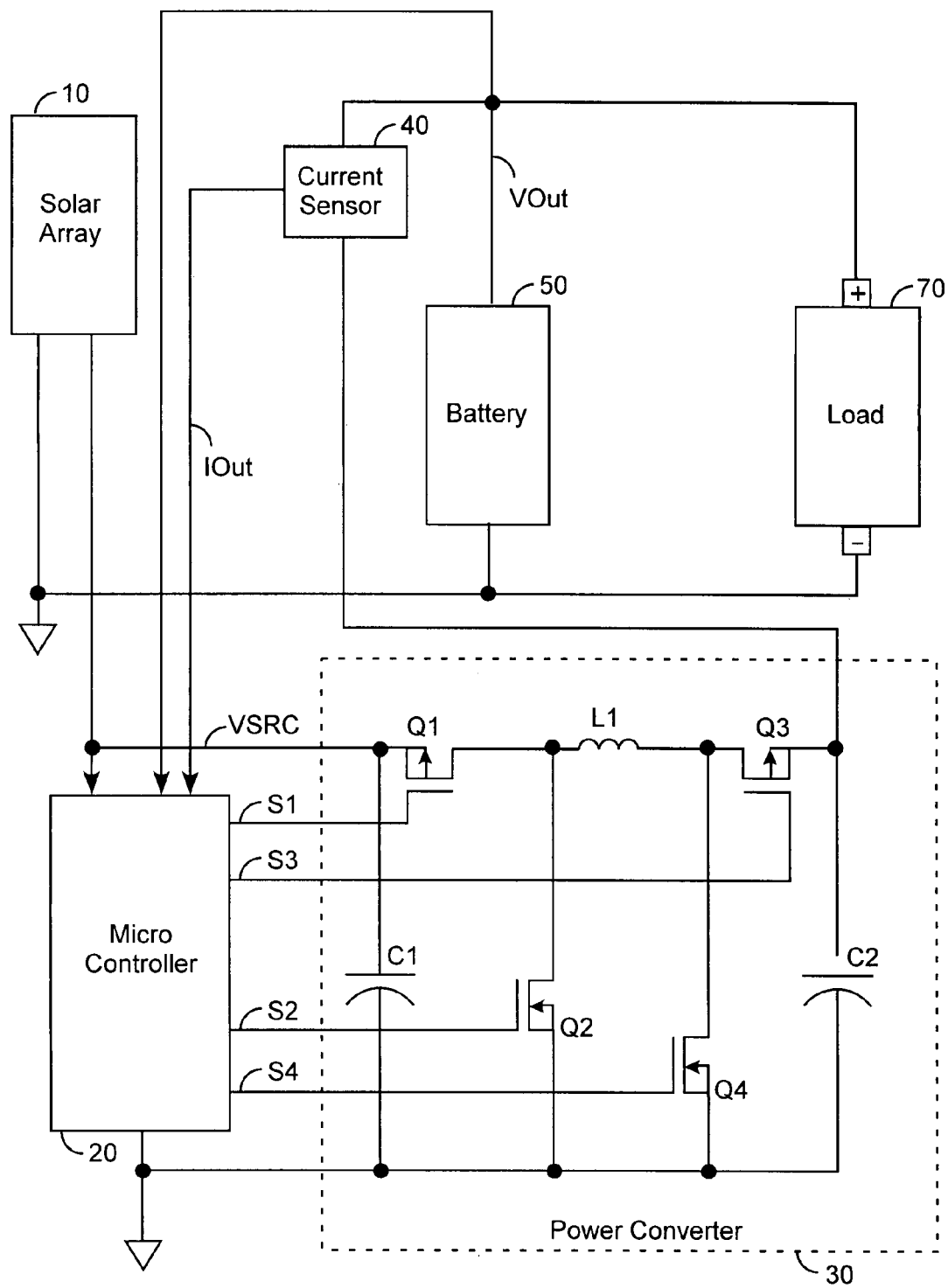
FIG. 1 is a block diagram of a multimode power module system.

An embodiment of the invention is described with reference to the figures using reference designations as shown in the figures. Referring to FIG. 1, a multimode power module system is used to transfer power from a source 10, such as a solar array, under power transfer control of a microcontroller 20 using a power converter 30 and a current sensor 40. The power transfer is from the array 10 to an output that typically includes a battery 50 and a load 70. The power converter 30 provides an output voltage VOut that passes through current sensor 40 to the battery 50 and load 70. The source voltage VSRC and the output voltage VOut and the output current IOut are sensed by the microcontroller 20. The output current and output voltage determine output power delivered to the battery 50 and load 70.

The microcontroller 20 provides under process control, four switch output signals S1, S2, S3, and S4 that are respectively connected to, and used to turn on and off, four switching transistors Q1, Q2, Q3, and Q4 in the power converter 30. Many conventional power converters are available. The power converter 30 having only Q1, Q2, Q3, Q4, C1, C2, and L1 is a conventional component. The microcontroller 20 and converter 30 receive the source voltage VSRC from the array 10. The source voltage VSRC is connected to transistor Q1. The converter 30 provides output current IOut that is passed through the current sensor 40 for sensing the output current IOut and providing an IOut signal to the microcontroller 20. The microcontroller 20 drives the power converter 30 to control the power transfer from the array 10 to the battery 50 and to the load 70. The power converter 30 also includes capacitors C1 and C2, between which is connected an inductor L1. The capacitors C1 and C2 and inductor L1 are used to average states of switches Q1, Q2, Q3, and Q4 for power transfer smoothing. Power from the source 10 is transferred through the converter 30 and more particularly through transistor Q1, inductor L1, and transistor Q3, the latter of which provides the output current IOut and output voltage VOut to the battery 50.

Referring to FIGS. 1 through 3, and more particularly to FIG. 3, the power module mostly operates in either direct energy transfer (DET), or peak power tracking (PPT). The microcontroller 20 drives the power converter 30 to operating the power module in several modes including DET, boost PPT, buck PPT, eclipse standby, and charge limit modes. In the DET mode, the converter 30 connects the solar array 10 directly to the battery 50 and load 70 so that source voltage VSRC is equal to VOut. The transistors Q1 and Q3 are on while switches Q2 and Q4 are off. The DET mode is selected when the maximum power voltage of the array 10 is approximately equal to the battery voltage VOut. The product of the output current IOut and output voltage VOut are sensed by the microcontroller 20 to determine an output power POut used for mode control. The DET mode is highly efficient because switching losses and microcontroller demands are minimal. During the DET mode, the microcontroller 20 enters a reduced power state but periodically re-evaluates operating conditions for a mode change.

The buck and boost PPT modes adjust operation for maximum solar source power generation. The buck PPT mode is selected when source voltage VSRC is greater than VOut for maximizing the output power POut. During the buck PPT mode, transistors Q1 and Q2 alternately switch on and off at a high frequency while transistor Q3 is on and transistor Q4 is off. The boost PPT mode is selected when the source voltage VSRC is less than the output voltage VOut for maximizing the output power POut. During the boost PPT mode, transistors Q3 and Q4 alternately switch on and off at a high frequency while transistor Q1 is on and transistor Q2 is off.

The charge limit mode is selected to reduce output power to battery 50 when fully charged. Switching states of the transistors Q1, Q2, Q3, and Q4 are selected to drive solar array 10 toward an open circuit or a short circuit to reduce output power for protecting the battery from an over charge.

The eclipse standby mode is selected when solar array 10 ceases power generation due to lack of solar illumination. The four converter transistors Q1, Q2, Q3, and Q4 are driven by the microcontroller 20 to be turned off. During the eclipse standby mode, the microcontroller 20 enters a reduced power state but periodically re-evaluates the operating conditions for a mode change.

The switching waveforms are shown for the operating modes starting with the eclipse standby mode where all converter switches are off, to the charge limit mode where output power is reduced. The modes may cycle through a typical sequence starting with a solar eclipse. After the eclipse standby mode, the buck PPT mode is then used to deliver a maximum power from a cold solar array following eclipse to provide output power to the battery and load. As the solar array warms up, the most efficient DET mode is then used as the array reaches nominal temperatures and solar source power VSRC. The boost PPT mode is then used as the array heats to the point that extra array power extracted by PPT surpasses the power losses during the PPT modes. Finally, in the charge limit mode, the duty cycle of the transistor Q3 and Q4 are adjusted to reduce the output power POut as the battery 50 has been fully charged. The switching waveforms of the switch outputs S1, S2, S3, and S4 are driven by the microcontroller 20 to uniquely drive the power converter 30 during the different operating mode under a computer program control. The microcontroller 20 uses a computer program to implement a multimode power module process for perfecting the operating modes of the multimode power module system.

Figure 4:
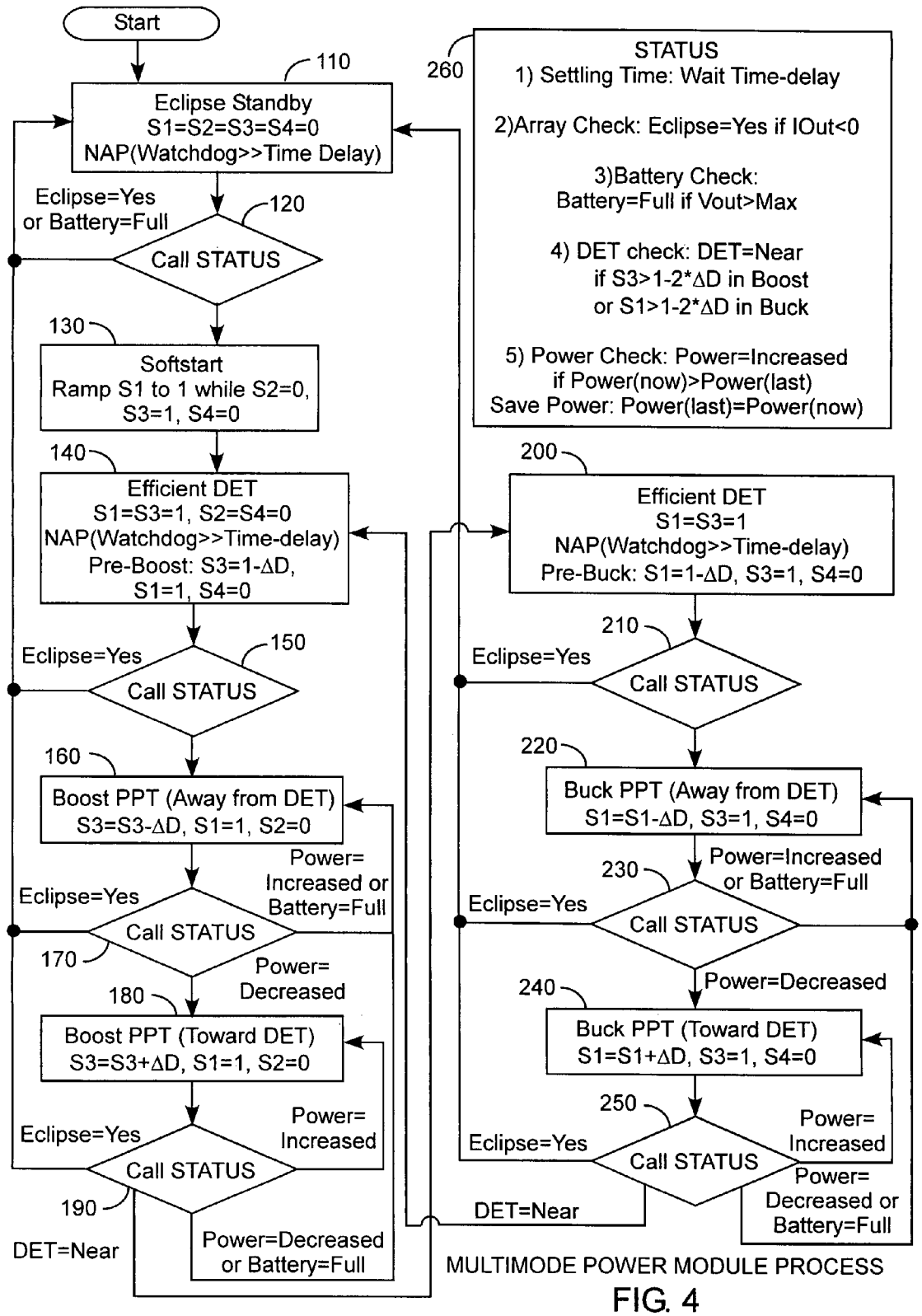
FIG. 4 is a flow diagram of a multimode power module process.

Referring to all of the Figures, and more particularly to FIG. 4, the multimode power module process is illustrated by way of a flowchart as method steps.

In Step 110, switch signals S1, S2, S3, and S4 are held in the off state to disconnect solar array 10 from the battery 50 in eclipse standby mode. During a NAP period, the microcontroller 20 enters standby to reduce operating current. A watchdog timer terminates NAP period after an interval time that is long relative to a time delay in a STATUS check of step 120. Average power consumption of the system is thereby reduced while allowing for periodic operational evaluations.

In Step 120, a STATUS subroutine in Step 260, is called to perform five prioritized actions that evaluate system operations and conditions, including Settling Time, Array Check, Battery Check, DET Check, and Power Check. If the solar array 10 is eclipsed or the battery 50 is fully charged, then Step 110 is repeated. Otherwise, Step 130 is executed.

In Step 130, switch signal S3 is turned on, then the duty cycle of switch signal S1 is ramped up from zero to full conduction in a Softstart while switch signals S2 and S4 are turned off. The Softstart gradually increases power to minimize transients to full power.

In Step 140, switch signals S1 and S3 are turned on while switch signals S2 and S4 are turned off in a NAP for efficient DET. Prior to exiting Step 140, the duty cycle of switch signal S3 is decremented from full conduction by one time interval AD while switch signal S4 is switched to be out-of-phase with switch signal S3. The power converter 30 then operates at the onset of boosting in preparation for a boost PPT evaluation.

In Step 150, the STATUS subroutine is called and the value of output power Pout=(VOut)(IOut) at the onset of boost PTT is saved. If the Solar array is eclipsed, then Step 110 is executed. Otherwise Step 160 is executed.

In Step 160, the duty cycle of the switch signal S3 is decremented one time interval AD away from DET so as to lower the solar array voltage during boost PPT. The output power VOut may then be evaluated for decreasing the duty cycle of the switch signal S3.

In Step 170, the STATUS subroutine is called and a Settling Timeout action is executed and satisfied. If the solar array 10 is eclipsed, then Step 170 is exited and Step 110 is executed. If the battery 50 is fully charged, then Step 160 is repeated until solar array voltage VSRC is reduced so as to reduce the solar power to a low power level. If output power POut has increased as a result of switch signal S3 being decremented in Step 160, then Step 160 is repeated so as to further increase the output power Pout. If output power POut has decreased as a result of switch signal S3 being decremented in Step 160, then Step 190 is executed to evaluate output power POut for potentially increasing the duty cycle of the switch signal S3.

In Step 180, the duty cycle of switch signal S3 is incremented one time interval AD toward DET to increase the solar array voltage in Boost PPT. Output power POut resulting from increasing the duty cycle of the switch signal S3.

In Step 190, the STATUS subroutine is called and the Settling Timeout action is executed and satisfied. If the solar array 10 is eclipsed, then Step 170 is exited and Step 110 is executed. If the battery 50 is fully charged, then Step 160 is repeated until solar array voltage VSRC is reduced to a low power level. If Boost PPT has driven the operation back near DET, then Step 200 is executed for efficient DET and NAP. If output power POut has increased as a result of incrementing the duty cycle of switch signal S3 then Step 180 is repeated to further increase output power POut. If output power POut has decreased as a result of incrementing the duty cycle of switch signal S3 in Step 180, then Step 160 is executed to evaluate the output power POut resulting from decreasing the duty cycle of switch signal S3.

In Step 200, switch signals S1 and S3 are turned on while switch signals S2 and S4 are turned off during NAP for efficient DET. Prior to exiting Step 200, the duty cycle of switch signal S1 is decremented from full conduction by one time interval AD while the switch signal S2 is switched out-of-phase with switch signal S1. The converter 20 then operates at the onset of Buck PPT in preparation for a Buck PPT evaluation.

In Step 210, the STATUS subroutine is called and the value of output power POut at the onset of Buck PPT is saved. If the solar array 10 is eclipsed, then Step 110 is executed. Otherwise, Step 220 is executed.

In Step 220, the duty cycle of switch signal S1 is decremented one time interval AD away from DET to raise the solar array voltage VSRC in Buck PPT. The output power POut may then be evaluated as a result of decreasing the duty cycle of the switch signal S1.

In Step 230, the STATUS subroutine is called and the first flow option satisfied is executed. If the solar array 10 is eclipsed, then Step 230 is exited and Step 110 is executed. If the battery 50 is fully charged then Step 220 is repeated until solar array voltage VSRC is increased to a low power level. If output power POut has increased as a result of decrementing the duty cycle of the switch signal S1 in Step 220, then Step 220 is repeated to further increase output power POut. If output power POut has decreased as a result of decrementing the duty cycle of the switch signal S3 in Step 220, then Step 240 is executed to evaluate the output power POut as a result of increasing the duty cycle of switch signal S1.

In Step 240, the duty cycle of switch signal S1 duty is incremented one time interval AD toward DET to decrease the solar array voltage VSRC in Buck PPT. The output power POut may then be evaluated for increasing the duty cycle of switch signal S1.

In Step 250, the STATUS subroutine is called and the new value of output power POut is saved. If the solar array 10 is eclipsed, then Step 170 is exited and Step 110 is executed. If the battery is fully charged, then Step 220 is repeated until solar array voltage VSRC is increased to a low power level. If Buck PPT has driven operation back near DET, then Step 140 DET and NAP is executed. If output power POut has increased as a result of incrementing the duty cycle of switch signal S1 in Step 240, then Step 240 is repeated to further increase output power POut. If output power POut has decreased as a result of incrementing the duty cycle of switch signal S1 in Step 240, then Step 220 is executed to evaluate output power POut with respect to decreasing the duty cycle of the switch signal S1.

In Step 260, the STATUS subroutine includes six prioritized actions that are performed to evaluate the operation of the multimode power module. The actions including Settling Timeout, Array Check, Battery Check, DET check, and Power check. The Settling Timeout is used to wait a Timedelay for the system to stabilize after changing the state of the power converter transistors. The Array Check is used to turn off the transistors Q1, Q2, Q3, and Q4 if array 10 is not generating power, indicated by a negative solar array current where IOut less than zero. The Battery Check is used to determine if the battery 50 is above a maximum charge where VOUT is greater than a maximum value so that the process will reduce the output power POut. The DET Check is used to determine if the current boost or buck PPT mode has driven the operation back to near DET indicating that the current PPT mode is not maximizing output power, so that subsequent process decisions will execute DET and NAP. The Power Check is used to compare the current level of the output power POut=(VOut)(IOut) to the last power check level for maximization of output power POut through mode selection and duty cycle adjustments.

The multimode power module process enables the effective selection of operational modes for efficient transfer of power from the array 10 to the battery 50 and load 70. When in PPT and near DET conditions, the system will select DET even when PPT receives more power from the array 10. In the near DET operation, DET delivers more power to the battery even though PPT is generating more solar power because DET is more efficient in power transfer. Several power modules can be connected in series or parallel to increase power transfer to large loads. A physical implementation of the multimode power module includes packaging solar arrays, electronics, and battery all together to enable easy scalability of parallel and series modules. The multimode power module delivers increase load power at higher efficiencies. The power module is particularly effective in low power systems such as miniature satellites and self-powered space experiments. The power module can also be applicable to commercial terrestrial applications.

The invention is directed to a multimode power module system that automatically selects one of multiple operating modes to maximize output power when a battery is not fully charged. The power module system has reduced component count and uses only a few conventional components including the power converter 30, microcontroller 20, current sensor 40, solar array 10, and battery 50. The power module is well suited to low power systems such as miniature satellites because power losses associated with PPT are significantly reduced relative to overall power transfer. The power module system enables DET, boost PPT, buck PPT, charge limit, and eclipse standby operating modes. The multimode power modules can be connected in parallel or series to accommodate different power requirements. Those skilled in the art can make enhancements, improvements, and modifications to the invention, and these enhancements, improvements, and modifications may nonetheless fall within the spirit and scope of the following claims.

What is claimed is:

1. A system for providing power from a power source to a load, the system comprising,
    a converter for providing output power from the source to the load by different modes, the modes comprising direct energy transfer for efficient direct connection of the source to the load and peak power tracking,
    the peak power tracking mode including a buck peak power tracking submode for transferring maximum power from the source to the load by adjustment of the converter operating point, and a boost peak power tracking submode for transferring maximum power from the source to the load by adjustment of the converter operating point,
    the converter comprising at least four switches driven by at least four switch signals,
    an output sensor for determining output power from the converter, and
    a processor for monitoring the output power for autonomously selecting one of the modes at any one time and for providing switch signals for controlling the converter,
    wherein the system operates in direct energy transfer mode to maximize the power delivered to the load at a time when source power in peak power tracking mode exceeds source power in direct energy transfer mode by an amount X, where X is greater than zero, and power losses between the source and the load exceed X in peak power tracking mode.

2. The system of claim 1 wherein, the power source is a solar array.

3. The system of claim 1 wherein,
    the switch signals are four switch signals,
    the converter comprises four switches respectively driven by the four switch signals,
    a first two switches for communicating power from the source to the battery and load,
    the converter comprises an inductor disposed between the first two switches, and
    a second two of the four switches for providing a current path to ground for the inductor.

4. The system of claim 1 wherein,
    the switch signals are four switch signals,
    the converter comprises four switches respectively driven by the four switch signals,
    a first two switches for communicating power from the source to the battery and load,
    the converter comprising an inductor disposed between the first two switches,
    a second two of the four switches for providing a current path to ground for the inductor,
    the converter comprises a first capacitor for coupling the source voltage to ground and comprises a second capacitor for coupling the output voltage to ground, and
    the converter is a conventional power regulator device.

5. The system of claim 1 wherein,
    the different modes are selected from a group consisting of direct energy transfer, boost peak power tracking, buck peak power tracking, eclipse standby, and charge limit.

6. The system of claim 1 wherein,
    the different modes comprise direct energy transfer and buck peak power tracking and boost peak power tracking,
    the switch signals are at least four switch signals,
    the converter comprises four switches respectively driven by the four switch signals,
    a first two switches for communicating power from the source to the load,
    the converter comprising an inductor disposed between the first two switches,
    a second two of the four switches for providing a current path to ground for the inductor,
    a third two of the four switches alternatively switching during buck peak power tracking,
    the fourth two of the four switches alternatively switching during boost peak power tracking, and
    the first two switches are turned on while the second two switches are turned off during direct energy transfer.

7. The system of claim 1 wherein,
    the different modes further comprise an eclipse standby mode that is selected when there is not enough power available from the source to deliver power to the load.

8. The system of claim 1 wherein,
    the different modes further comprise a charge limit mode that is selected when output voltage is above a maximum level.

9. The system of claim 1 wherein,
    the switch signals are at least four switch signals,
    the converter comprises four switches respectively driven by the four switch signals,
    a first two switches for communicating power from the source to the battery and load,
    the converter comprising an inductor disposed between the first two switches,
    a second two of the four switches for providing a current path to ground for the inductor,
    the converter comprises a first capacitor for coupling the source voltage to ground and a second capacitor for coupling the output voltage to ground,
    the converter is a conventional power regulator device,
    the different modes further comprise an eclipse standby mode and a charge limit mode,
    the eclipse standby mode is selected when there is not enough power available from the source to deliver power to the load,
    the charge limit mode is selected when output voltage is above a maximum level, and
    the four switches are turned on and off with varying duty cycles for incrementally increasing and decreasing power from the power source to the load during peak power tracking.

10. A system for providing power from a power source to a load having a load voltage and a load current, the system comprising,
    a battery for storing energy and having a battery voltage, a power source having a source voltage and providing power to the load and battery, a converter for communicating power from the power source to the battery and load by different modes, the modes including a direct energy transfer mode and peak power tracking mode, a current sensor for sensing a converter output current, a processor for monitoring the power source voltage and the battery voltage and the converter output current, the processor for selecting one of the modes at any one time, the processor for providing four switch signals to respective converter switches for controlling the converter, a first two of the four switches for communicating power from the source to the battery and load, a second two of the four switches for providing a current path to ground for an inductor, the inductor disposed between the first two switches, and the processor for operating the system in a selected mode of the different modes.

11. A system for providing power from a power source to a load having a load voltage and a load current, the system comprising, a battery for storing energy and having a battery voltage, a power source having a source voltage and providing power to the load and battery, a converter for communicating power from the power source to the battery and load by different modes, the modes comprising direct energy transfer mode and peak power tracking mode, the converter including four semiconductor power switches, the direct energy transfer mode being enabled by discontinuing pulse width modulation operation and opening a first two of the power switches providing a current path to ground for an inductor and closing a second two of the power switches for communicating power from the source to the load, a current sensor for sensing a converter current, and a processor for monitoring the source voltage and the battery voltage and the converter output current for selecting one of the modes at any one time and for providing switch signals for controlling the converter for operating the system in a selected mode of the different modes.

12. A system for providing power from a power source to a load, the system comprising, a converter for providing output power from the source to the load by different modes, the modes comprising direct energy transfer and peak power tracking, the peak power tracking mode including submodes buck peak power tracking and boost peak power tracking, the converter comprising four switches driven by respective switch signals, an output sensor for determining output power from the converter, a processor for controlling the switch signals, and the processor for monitoring the output power for autonomously selecting one of the modes at any one time.

13. The system of claim 12 wherein the processor provides switch signals that operate the system in the direct energy transfer mode at a time when i) peak power tracking maximizes source power but ii) direct energy transfer maximizes power to the load.

14. The system of claim 12 further comprising the processor for providing switch signals for operating the system in the direct energy transfer mode at a time when power to the load in direct energy transfer mode exceeds power to the load in peak power tracking mode due to converter losses being greater than the excess of source power in peak power tracking mode over source power in direct energy transfer mode.

15. The system of claim 12 further comprising, the source and the load interconnected by a current path passing through the converter, and processor configurations including a low loss configuration for operating the converter such that with respect to a common reference the voltage along the current path is essentially unchanged by the converter.

16. The system of claim 15 wherein direct energy transfer occurs when the processor utilizes the low loss configuration to operate the converter.

* * * * *